(12) United States Patent
Letzelter et al.

(10) Patent No.: US 9,111,053 B2
(45) Date of Patent: Aug. 18, 2015

(54) OPERATIONS ON SHAPES DIVIDED IN PORTIONS

(75) Inventors: Frédéric Letzelter, Longjumeau (FR); Rainer Lührs, Burgwedel (DE)

(73) Assignee: Dassault Systemes, Velizy Villacoublay (FR)

( * ) Notice: Subject to any disclaimer, the term of this patent is extended or adjusted under 35 U.S.C. 154(b) by 541 days.

(21) Appl. No.: 13/457,017

(22) Filed: Apr. 26, 2012

(65) Prior Publication Data

US 2012/0280984 A1 Nov. 8, 2012

(30) Foreign Application Priority Data

May 6, 2011 (EP) .................................... 11305549

(51) Int. Cl.
*G06T 17/20* (2006.01)
*G06F 17/50* (2006.01)
*G06T 19/00* (2011.01)

(52) U.S. Cl.
CPC ............... *G06F 17/50* (2013.01); *G06T 19/00* (2013.01); *G06T 2200/24* (2013.01)

(58) Field of Classification Search
USPC .................................................. 345/419, 442
See application file for complete search history.

(56) References Cited

U.S. PATENT DOCUMENTS

| | | | |
|---|---|---|---|
| 5,367,372 A | 11/1994 | DiVita et al. | |
| 5,425,109 A | 6/1995 | Saga et al. | |
| 6,233,351 B1 | 5/2001 | Feeney et al. | |
| 7,099,803 B1 * | 8/2006 | Rappoport et al. | 703/1 |
| 7,248,270 B1 | 7/2007 | Boylan | |
| 7,324,691 B2 | 1/2008 | Li et al. | |
| 7,439,987 B2 | 10/2008 | Boose et al. | |
| 7,613,539 B2 * | 11/2009 | Bae et al. | 700/182 |
| 7,696,998 B2 | 4/2010 | Bae | |
| 8,259,101 B2 * | 9/2012 | Shimada et al. | 345/419 |
| 8,429,174 B2 | 4/2013 | Ramani et al. | |
| 8,773,431 B2 | 7/2014 | Joshi et al. | |
| 8,878,841 B2 | 11/2014 | Letzelter | |

(Continued)

FOREIGN PATENT DOCUMENTS

| | | |
|---|---|---|
| WO | WO 2007/098243 A2 | 8/2007 |
| WO | WO 2007/146069 A2 | 12/2007 |
| WO | WO 2008/103775 A2 | 8/2008 |

OTHER PUBLICATIONS

Agrawal, M., et al., "Context Aware 1-14 On-line Diagramming Recognition", *Frontiers in Handwriting Recognition (ICFHR), 2010 International Conference On*, IEEE, pp. 682-687 (2010).

(Continued)

*Primary Examiner* — Kimbinh T Nguyen
(74) *Attorney, Agent, or Firm* — Hamilton, Brook, Smith & Reynolds, P.C.

(57) ABSTRACT

It is provided a computer-implemented method for designing a CAD modeled object. The method comprises displaying several three-dimensional parametric shapes on a screen, wherein each of the several three-dimensional parametric shapes is divided in several portions, a different design operation being assigned to each portion; user-interacting with the screen; determining one portion upon a location of the user-interacting on a support, the determining being performed among all the portions; and performing, on the shape to which the determined portion belongs, the operation assigned to this portion. Such a method makes the design of a CAD modeled object easier.

20 Claims, 5 Drawing Sheets

(56) References Cited

U.S. PATENT DOCUMENTS

| | | | |
|---|---|---|---|
| 8,941,681 | B2 | 1/2015 | Letzelter |
| 2003/0025694 | A1 | 2/2003 | Davis |
| 2004/0249809 | A1 | 12/2004 | Ramani et al. |
| 2006/0082571 | A1 | 4/2006 | McDaniel |
| 2007/0276214 | A1 | 11/2007 | Dachille et al. |
| 2008/0036771 | A1 | 2/2008 | Bae |
| 2010/0007664 | A1 | 1/2010 | Cao |
| 2011/0084692 | A1 | 4/2011 | Billeres et al. |
| 2012/0280981 | A1 | 11/2012 | Letzelter |
| 2012/0280982 | A1 | 11/2012 | Letzelter |
| 2012/0280983 | A1 | 11/2012 | Letzelter |
| 2012/0283998 | A1 | 11/2012 | Letzelter |
| 2012/0287121 | A1 | 11/2012 | Hong et al. |

OTHER PUBLICATIONS

Anonymous, "Nemetschek Campus Allplan 2005. Step by 1-14 Step. Advanced 3D", [Online] Retrieved from the Internet URL:http://bim.allplan.si/literatura/2005/Step%20by%20Step%20Allplan%202005%20-%20Advanced%203D.pdf [retrieved on Feb. 3, 2010] (2005) p. 126-p. 140.

Anonymous: "Centroid", Retrieved from the Internet URL:http://en.wikipedia.org/w/index.php?title=Special:Book&bookcmd=download&collection_id=4c6921d7317cbblb&writer=rl&return_to=Centroid [retrieved on Aug. 23, 2011] pp. 1-14.

Eggli, et al., "Inferring 3D Models from Freehand Sketches and Constraints," *Computer Aided Design*, 29(2): 101-112 (1997).

Igarashi, T., et al., "A Suggestive Interface for 3D Drawing," [Online] Retrieved from the Internet: URL:http://delivery.acm.org/10.1145/1290000/1281531/a20-igarashi.pdf?ip=145.64.134.245&CFID=40190234&CFTOKEN=26502069&_acm_=1314782992_a, pp. 1-9 (2007).

Kara, L.B. and Stahovich, T.F., "An Image-Based, Trainable Symbol Recognizer for Hand-Drawn Sketches," *Computer Graphics*, 29;501-517 (2005).

McCrae, J.P., "Sketch-Based Path Design," pp. I-52 (2008). [Online] Retrieved from the Internet:URL:http://www.dgp. [retrieved on Dec. 19, 2011].

Mohamed, K.A., "Concepts and Solutions for Efficient Handling of the Digital Ink," Retrieved from the Internet:URL:http://www.freidok.uni-freiburg.de/volltexte/7361/pdf/thesis_final_khaireel_a_moharned Mar 2010.pdf—[retrieved on Dec. 19, 2011].

Qin, S. F., et al., "From on-line Sketching to 2D and 3D Geometry: A System Based on Fuzzy Knowledge," Computer Aided Design, 32(14): 851-866 (2000).

Xiangyu, et al., "On-line Graphics Recognition," *Proceedings of the 10$^{th}$ Pacific Conference on Computer Graphics and Applications* (2002).

Zeleznik, R.C., et al., Sketch: An Interface for Sketching 3D Scenes, *Computer Graphics Proceedings, Annual Conference Series*, 163-169 (1996).

Zhiquan Zhou, et al. "SS-Based Sketch Recognition for Graphics of Traffic Accident," Fuzzy Systems and Knowledge Discovery, 2010 *Seventh International Conference on Fuzzy Systems and Knowledge Discovery, IEEE*, 2558-2562.

European Search Report for 11 30 5545, dated: Aug. 29, 2011.
European Search Report for 11 30 5546, dated: Aug. 25, 2011.
European Search Report for 11 30 5547, dated: Dec. 20, 2011.
European Search Report for 11 30 5548, dated: Sep. 2, 2011.
European Search Report for 11 30 5549, dated: Sep. 9, 2011.
Anonymous, "Bivector", Wikipedia (accessed on May 6, 2011).
Anonymous, "Exterior Algebra", Wikipedia (accessed Apr. 8, 2011).
Baudel, T., "A Mark Based Interaction Paradigm for Free-Hand Drawing," *LRI, Université de Paris-Sud, CNRS URA* 410 France. (1994).

Brinsmead, D., "A Ribbon With Twist Control.pdf", Duncan's Corner, pp. 1-3 (Feb. 13, 2007).

European Search Report in European Patent Application No. 11305564.4 dated Jan. 26, 2012.

Igarashi, Takeo, et al., "Teddy: A Sketching Interface for 3D Freeform Design", *Computer Graphics Proceedings, SIGGRAPH* 99, pp. 409-416 (Aug. 8, 1999).

Keller, E. "Paint Effects and Toon Shading", Chapter 8, *Mastering Autodesk Maya 2011: Autodesk Official Training Guide*, pp. 417-469 (Sep. 7, 2010).

Keller, E., "Tutorial 4: Paintfx—Plasma Membrane Animation Techniques", pp. 1-21 (Dec. 29, 2009).

Mizuno S., "A Method to Create Sculptures With Chinkin in the Virtual Space", Virtual Systems and Multimedia (VSMM), 2010 16$^{th}$ International Conference On, IEEE, Piscataway, NJ, pp. 215-222 (Oct. 20, 2010).

Olsen L., et al., "Sketch-Based Modelling: A Survey", *Computers and Graphics*, Elsevier, Gb, 33(1):85-103 (Feb. 1, 2009).

\* cited by examiner

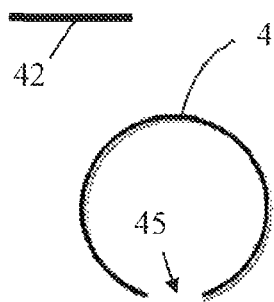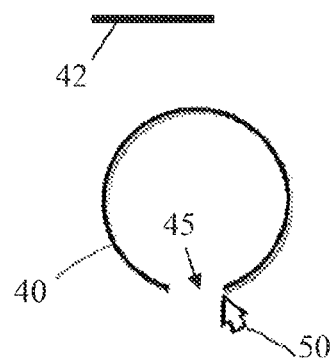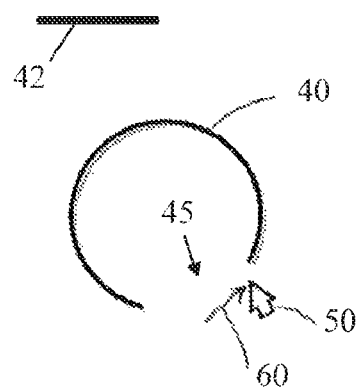
FIG. 4     FIG. 5     FIG. 6
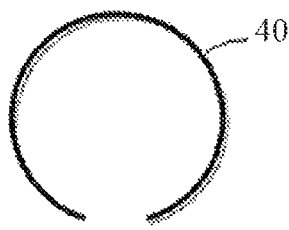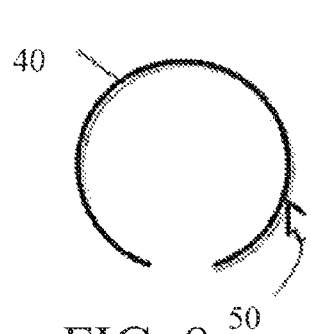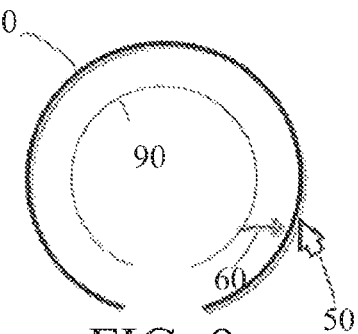
FIG. 7     FIG. 8     FIG. 9
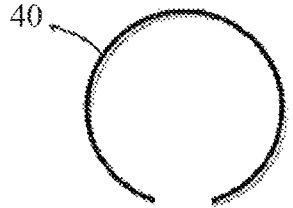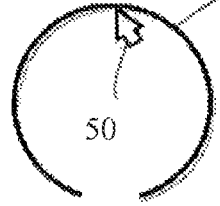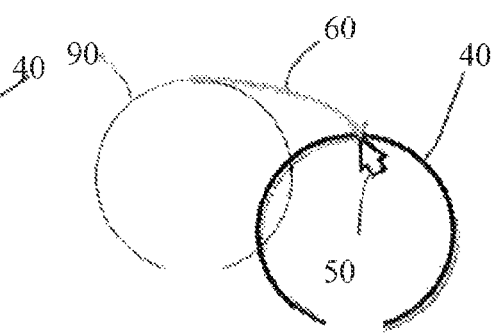
FIG. 10     FIG. 11     FIG. 12

OPERATIONS ON SHAPES DIVIDED IN PORTIONS

RELATED APPLICATION(S)

This application claims priority under 35 U.S.C. §119 or 365 to European Patent Application No. 11305549.5, filed May 6, 2011.

The entire teachings of the above application(s) are incorporated herein by reference.

FIELD OF THE INVENTION

The invention relates to the field of computer programs and systems, and more specifically to a method, system and program for designing a CAD modeled object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Traditionally, the design of an object to be manufactured undergoes several phases which notably include the "ideation" phase and the "concept" phase. During the ideation phase, a specialist designer, who is a specialist of the technical field, designs a two-dimensional (2D) drawing of the object, typically on a paper with a pen. During the concept phase, a CAD designer, who is familiar with the use of CAD systems, designs a three-dimensional (3D) parametric model corresponding to the 2D drawing. The 3D model contains specifications including parametric functions which allow the ulterior phases necessary to the manufacturing of the object.

At the time being, CAD systems are very complex to use. Indeed, most design operations require many interventions by the user. For example, for a single design operation on a shape, the user typically has to select the design operation through an icon or a menu provided by the GUI of the CAD system, select shapes which are already designed, and enter parameters of the operation e.g. in dialog boxes, etc. All these steps are time-consuming for the user. The user may also have difficulties accomplishing all these interventions. For example, the user may hardly find the correct icon, or the user may have no idea of the value of the parameters, or the user may find it hard to select a small shape when the selection has to be done by clicking exactly on the shape with a mouse. One consequence is that the GUIs of current CAD systems are often overloaded with icons. Furthermore, the workflow of the user is often broken as some interventions are always needed. The use of current system has thus low ergonomics and poor user-experience. This all leads to a lack of productivity.

Another consequence of this complexity is that the specialist designer and the CAD designer are most likely two different persons, since it is difficult for the specialist designer to use the CAD system. This implies a necessity for communication in order to smoothly link the "concept" phase to the "ideation". Such communication requires time, and it presents other issues. For example, sometimes the 3D model does not correspond to the 2D drawing well enough and many corrections have to be performed.

Some software offer to select an object by mouse clicking on the object. This is the case of Microsoft PowerPoint™ which is completely unrelated to parametric CAD design. Then, by moving the mouse continuously without releasing the click, the object may be moved. If the click is released, several manipulators appear. The user may select a manipulator by clicking on it for acting on the object. Not only such software do not apply to parametric CAD design, but also, only one operation for all objects is directly available to the user in case several objects are displayed (i.e. the move operation). For performing more elaborate actions, the user has to select the object and then act on some manipulators. The selection is performed by a click which must be precise, and these interventions are too numerous.

Within this context, there is still a need for an improved solution for designing a CAD modeled object.

SUMMARY OF THE INVENTION

According to one aspect, it is therefore provided a computer-implemented method for designing a CAD modeled object. The method comprises displaying several three-dimensional parametric shapes on a screen, wherein each of the several three-dimensional parametric shapes is divided in several portions, a different design operation being assigned to each portion; user-interacting with the screen; determining one portion upon a location of the user-interacting on a support, the determining being performed among all the portions; and performing, on the shape to which the determined portion belongs, the operation assigned to this portion.

The method may comprise one or more of the following:
- the determined portion is evaluated to be at a smallest distance on the support from the location of the user-interacting among all the portions;
- the determining comprises evaluating a distance on the support from the location of the user-interacting to all the portions, and selecting the portion at the smallest distance from the location of the user-interacting;
- the user-interacting comprises a triggering and a moving of a pointer, and the location of the user-interacting is a location of the pointer on the support at the triggering;
- the distance from the location of the user-interacting to a respective portion is a minimum of distances from the location of the user-interacting to points associated to the respective portion;

the points associated to the respective portion comprise shape points which are determined by discretizing the shape and then projecting the discretized shape on the support;

the support is the screen plane;

the three-dimensional parametric shapes comprise a central portion, to which a moving operation is associated, at least one extremity portion, to which an extension operation is associated, and/or at least one intermediate portion, to which an expansion operation is associated.

It is further proposed a CAD system comprising a memory for storing several three-dimensional parametric shapes, wherein each of the several three-dimensional parametric shapes is divided in several portions, a different design operation being assigned to each portion; and a graphical user interface coupled with the memory and a processor and suitable for performing the above method.

It is further proposed a computer program comprising instructions for performing the above method.

It is further proposed a computer readable storage medium having recorded thereon the above computer program.

BRIEF DESCRIPTION OF THE DRAWINGS

Embodiments of the invention will now be described, by way of non-limiting example, and in reference to the accompanying drawings, where:

FIGS. 4-21 show schematically examples of the method.

DETAILED DESCRIPTION OF THE INVENTION

Figure 1:
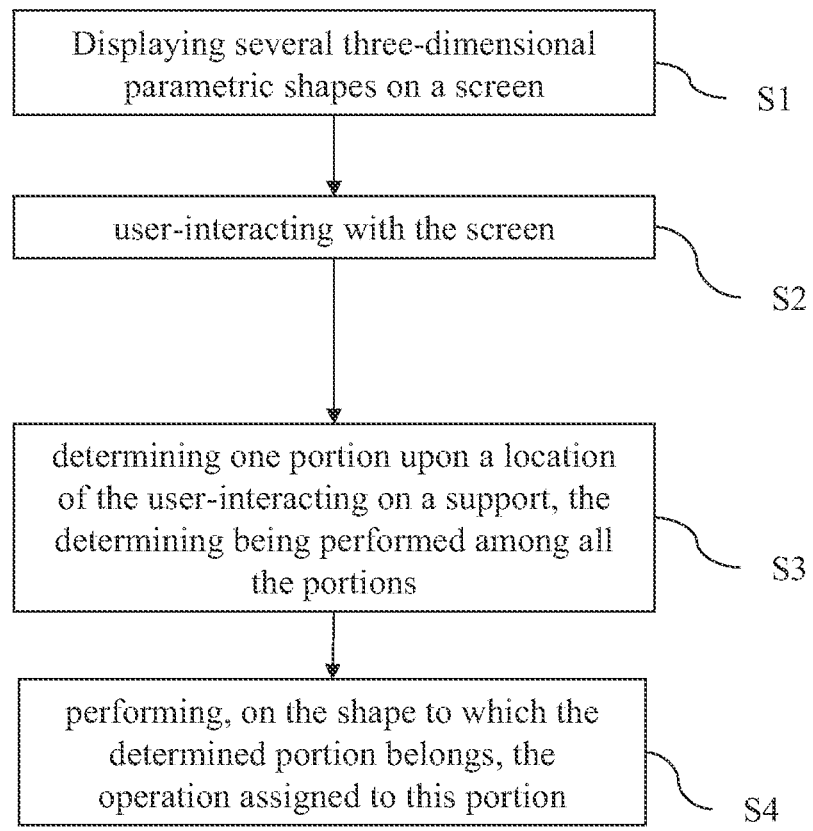
FIG. 1 shows a flowchart of an example of the method.

With reference to the flowchart of FIG. 1, it is proposed a method for designing a CAD modeled object. The method comprises displaying (S1) several three-dimensional parametric shapes on a screen. Each of the several three-dimensional parametric shapes is divided in several portions, a different design operation being assigned to each portion. The method also comprises user-interacting (S2) with the screen. The method then comprises determining (S3) one portion upon a location of the user-interacting on a support, the determining being performed among all the portions. The method then comprises performing (S4), on the shape to which the determined portion belongs, the operation assigned to this portion. Such a method improves the design of a CAD modeled object by making such design easier. Notably, the method allows the performing of different operations on different shapes a lot easier, with fewer user interventions.

The method is for designing a CAD modeled object. "Designing a CAD modeled object" designates any action or series of actions which is at least part of a process of elaborating a CAD modeled object. Thus, the method may comprise creating the CAD modeled object from scratch. Alternatively, the method may comprise providing a CAD modeled object previously created, and then modifying the CAD modeled object.

The method may be included in a manufacturing process, which comprises, after performing the method, producing a physical product corresponding to the CAD modeled object. Because the method makes the design easier, the method also makes the manufacturing of a product faster and thus increases productivity of the manufacturing process.

The method is computer-implemented. This means that the method is executed on at least one computer, or any system alike. Unless mentioned otherwise, all steps of the method are performed by the computer, i.e. without intervention of the user. For example, the steps of displaying (S1), determining (S3) and performing (S4) may be performed by the sole computer, whereas the step of user-interacting (S2) is one example of a step where the user intervenes. Of course, although computer-implemented, the method as a whole may be itself performed upon an intervention of the user, e.g. for triggering the method.

A typical example of computer-implementation of the method is to perform the method with a CAD system comprising a graphical user interface (GUI) suitable for this purpose. The CAD system comprises hardware and the GUI is suitable for performing the method without installing any software. In other words, software is already ready on the GUI for immediate use. In other words, the system comprises instructions coded on a memory coupled to the processor, the instructions providing means for performing the method. The GUI is coupled with a memory and a processor. The memory is any hardware suitable for the storage of information. Such a system is a tool with which the design of most CAD modeled objects is easy. Such a system may thus be used by a wide array of users, including specialist designers. For example, the steps which involve the user are performed through the GUI (comprising a screen for user-interaction with it), while the fully computerized steps are performed by the processor accessing the memory, without involvement of the GUI.

The information stored in the memory (i.e. several three-dimensional parametric shapes, wherein each of the several three-dimensional parametric shapes is divided in several portions, a different design operation being assigned to each portion) may be stored in the form of a database. By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The method and system generally manipulate modeled objects. A modeled object is any object defined by data stored in the memory. By extension, the expression "modeled object" designates the data itself. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space). A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file may contain specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The CAD modeled object may typically be a 3D modeled object. By "3D modeled object", it is meant any CAD object which is modeled by data allowing its 3D representation. A 3D representation allows the viewing of the represented object from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The CAD system may be history-based. In this case, a CAD modeled object is further defined by data comprising a history of geometrical features (i.e. CAD operations, i.e. operations offered by CAD systems to design the object). A CAD modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). This means that the creation history of design features is typically saved through an acyclic data flow linking the said geometrical features together through input and output links. In a history-based system, a CAD modeled object may be described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

Figure 2:
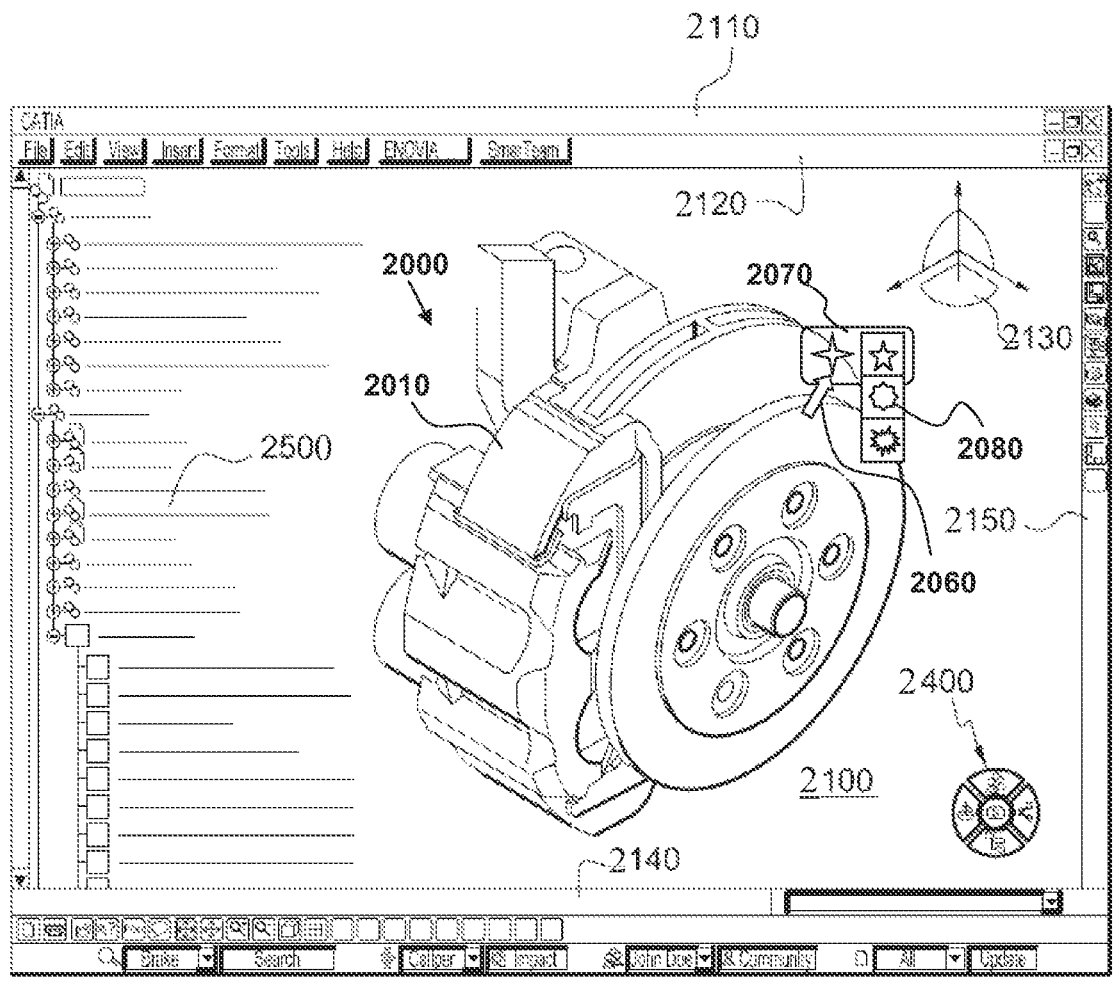
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc 2010. The GUI may further show various types of graphic tools 2130, 2070, 2080, 2400 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
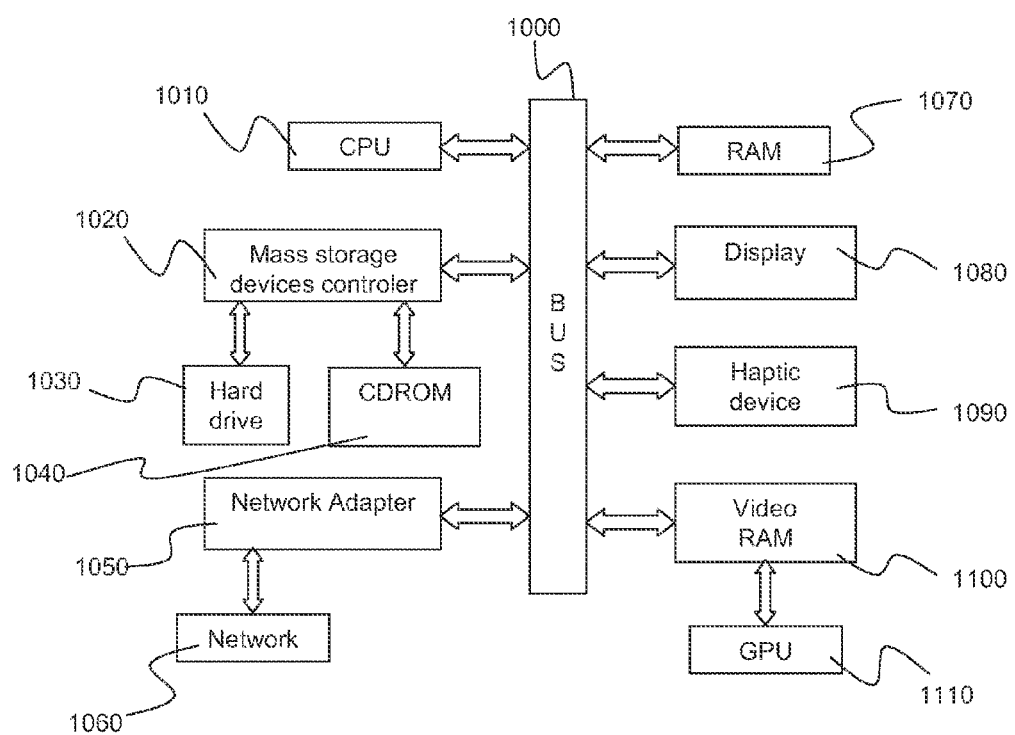
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on screen 1080, as mentioned with reference to FIG. 2. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

The steps (S1) to (S4) of the method are not necessarily consecutive. For example, the displaying (S1) may be performed continuously during the whole method (i.e. the shapes are continuously displayed). Also, the user-interacting (S2) may be continuous (i.e. have a duration in time e.g. superior to 100 ms) and be related to the determining (S3) and the performing (S4). For example, the user-interacting (S2) may trigger determining (S2), and, after the end of the determining (S2), the performing (S3). Thus, the performing (S3) may start before the user-interacting (S2) has ended, and be executed in a dynamic way, so as to appear concomitant to the user.

Displaying (S1) the three-dimensional (3D) parametric shapes is performed on the screen. The method helps the user designing the CAD modeled object. The CAD modeled object evolves as the designer designs the object, for example through the user-interacting (S2) with the screen. The 3D parametric shapes constitute specifications of the object. Thus, displaying (S1) the 3D parametric shapes helps the user decide how to perform design on the object. The displaying (S1) is in this sense closely linked to the user-interacting (S2). Indeed, the user-interacting (S2) typically acts on areas of the screen. This may be done directly, e.g. if the screen is sensitive (for example a single-touch or multi-touch screen) and the user applies pressure on the screen, or indirectly, e.g. by using a haptic device such as a mouse, or a touchpad on which a user can apply a touch-pen. This could also be done by pointing a laser on the screen or any other way of interacting with the screen, depending on the type of the screen. A user-interacting (S2) through a touchpad or a sensitive screen makes the user-interacting (S2) more life-like (i.e. more similar to the traditional ideation phase where a specialist designer designs the object on paper). A life-like method for designing CAD modeled object is helpful as it helps specialist designers to use the CAD system. The design is thus easier.

Several (i.e. at least two) 3D parametric shapes are displayed. The shapes are geometric forms for which there is a representation. The shapes may for example be curves, surfaces, points, and/or volumes. When the shapes are curves, the method is more life-like since a specialist designer often works on curves.

The shapes are 3D and parametric. This ensures that the CAD modeled object is ready for use as an input in a wide array of CAD operations. A 3D shape is modeled by data (i.e. such data is stored in the memory of the system) that allow the 3D representation of the shape. As discussed above, this excludes icons or 2D drawings. A parametric shape is modeled by at least one function of at least one parameter (i.e. such function is stored in the memory of the system). The function may provide the position of points of the shape. For example, a 3D parametric curve may be modeled by a function $C(u)=(x(u), y(u), z(u))$, e.g. a NURBS. In the field of CAD, modeling elements of the CAD modeled object such as the shapes with parametric functions allows for performing CAD operations on the shapes. Indeed, the CAD operations of most CAD systems are not performable on a simple pixel map which is a representation of an object. In other words, most CAD operations of CAD systems need the parametric function as an input to be executed.

The method is based upon a location of the user-interacting (S2) on a support. For example in the case of a computer monitor, by user-interacting (S2) with the screen, the user activates some pixels of the screen. These pixels may define locations on the screen, as known in the art. For example, if the user-interacting (S2) is performed through a pointing device or through a touch pen, the pixels activated correspond to the locations of the pointing device or the touch pen. These activated pixels may be dynamically displayed on the screen (e.g. through a stroke or a cursor moving on the screen). These locations on the screen may be translated in at least one location on the support. The support may be a geometrical entity (visible or invisible) adapted for receiving a location. The support may act as a socle for the design. The support may for example be any kind of surface. Such surface may be a plane, for example the screen plane, or any other drawing surface. Indeed, a drawing surface different from the screen plane may be embedded in the (design area of the) screen. In case the support is the screen plane, the activated pixels may directly and quickly provide the location. In case the support is not the screen plane, the location may be provided through a projection. This may be done for example by keeping track of the position of at least one of the pixels activated on the screen, and for example by projecting them on the drawing plane (when the drawing plane is different from the screen plane).

Each of the displayed several 3D parametric shapes is divided in several portions, a different design operation being assigned to each portion. By "divided", it is meant that the displayed shapes are geometrically split in portions. The portions are thus parts of the shapes which form the shape when assembled. This division is not necessarily displayed. From the implementation point of view, the division may consist in pointing portions of the shapes to different references. For example, in case of a parametric curve $C(u)=(x(u), y(u), z(u))$, wherein u belongs to an interval [a, b], the division may consist in pointing points of the curve $P_u=(x(u), y(u), z(u))$ to a different design operation depending on the value of the parameter u, the interval [a, b] being divided in at least as many sub-intervals as the number of portions foreseen. Additional parametric shapes with only one or no portion to which an operation is assigned may of course be displayed as well. To summarize, "each of the displayed several 3D parametric shapes is divided in several portions, a different design operation being assigned to each portion" strictly means that at least two specific shapes are displayed, wherein these two specific shapes are specific in that they each point to at least a pair of design operations, wherein the two operations within a pair are different (the two pairs being possibly the same), and wherein pointing to a pair of design operations means that a different portion of the shape points to a respective operation of the pair. A portion thus points to one design operation at most (i.e. a portion is assigned at most one design operation).

This pointing may be implemented by any means common to computer science. For example, the shapes may be of a type, the type providing fields indicating how to divide the shape in function of the parameters defining the shape and pointing to design operations in a library.

A design operation is any CAD operation provided by the CAD system that helps the user design the object. The design operations provided may thus depend on the system, but in any case the system provides at least two different design operations. Design operations may comprise, color edit operations (e.g. modify the color of a shape), information edit operations (e.g. modify information defining the shape such as a text linked to the shape, or make a phylactery appear), and/or geometrical CAD operations. A geometrical CAD operation is any operation provided by a CAD system that modifies the geometry of the modeled object (e.g. statistically). The data modeling the CAD object indeed include geometry specifications. For example, these specifications include positions and/or forms of the 3D shapes. Modifying the geometry of the modeled object means modifying at least one of such geometry specifications. These geometry specifications are notably gathered by the parametric function modeling the shapes. A geometrical CAD operation may thus use as an input the parametric functions. A geometrical CAD operation may be an operation which creates a new 3D parametric shape, which deletes an existing 3D parametric shapes, which modifies a 3D parametric shapes, which creates/deletes links between the existing parametric shapes.

Examples of classical geometrical CAD operations are now discussed. The CAD system may provide any or a combination of the examples. A "stretch" is a geometrical CAD operation. A stretch of a shape comprises increasing one dimension (e.g. the length or the width) of a shape, e.g. without modifying substantially the other dimensions of the shape. A "scale" is another geometrical CAD operation, which comprises increasing all dimensions of a shape proportionally. "Blend", "match" and "concaten" are other geometrical CAD operations which reunite two shapes. The blend creates an intermediate shape reuniting the two initial shapes. The result thus has three shapes. The match modifies one or both of the initial shapes to reunite them. The result thus has two shapes. The concaten creates a new shape to replace the two initial shapes, e.g. by interpolating them. The result thus has one shape. Other geometrical CAD operation comprise "move" operations, such as the "rotate" or the "translate" operations, which act on the position of input shapes. The "cut" operation divides a shape into two shapes. The "erase" operation erases a length of the shape. The "extrapol" operation applies a prediction scheme and increases a shape in a dimension following the prediction. The "corner" operation, or "fillet", rounds an angle of a shape or between two shapes. The "chamfer" operation cuts in a straight-line an angle of a shape or between two shapes. The "edit" operation modifies at least a part of a shape.

The method comprises determining (S3) one portion upon a location of the user-interacting (S2) on a support, the determining being performed among all the portions. The operation assigned to the determined portion is then performed (S4) on the shape to which the determined portion belongs. The method thus not only allows for performing the correct operation (following the user-intent), but also to perform the operation on the correct shape (also following the user-intent).

As explained earlier, the user-interacting (S2) may lead to defining at least one location on the support. The location data may include coordinates. The location allows the determining (S3) of a portion among all the portions of all the shapes, according to any means. For example, the nearest portion to the location is determined. Alternatively, the portion which is the most in vertical line with the location is determined. The implementation may be of any kind, as long as the determining (S3) is based on the location. Indeed, the location determines the user-intent in almost all situations, although it may determine the user-intent in a different way depending on the situation.

The fact that the determining (S3) is made among all portions means that all the portions are potentially determinable. In other words, all portions may be available for determination with the same level of difficulty in the user-interacting (S2) (i.e. the same type of user-interacting). Thus, iterating the method with a different user-interacting (S2) at each iteration would normally lead to a different portion, and thus a different operation to be performed. Thus, the method may be iterated with a different operation (possibly on a different shape) being performed at different iterations.

As a whole, the method allows for a fast performing (S4) of an operation which respects the user intent in the context of 3D parametric CAD. By a simple user-interacting, the intended operation may be performed, and the determining (S3) may rely on the location defined by the user-interacting (S2). In other words, the user-interacting does not need to bring more information than information for defining a location. Notably, the sequence comprising clicking on a shape to select it and then clicking on a different manipulator or icon to select the operation among different operations may be excluded by the method, which may only rely on the location. The method thus allows a fast and easy performance of the operation as the determination of the operation is fast and easy. Also, the user-intent is respected. The user-intent is all the more respected as the support is the screen plane.

The determined portion may be evaluated to be at a smallest distance on the support from the location of the user-interacting (S2) among all the portions. In other words, the portion which is determined at (S3) is the nearest portion to the user-interacting (S2). As the user naturally interacts next to the portion whose operation the user wants to perform, the method allows the automatic determination of the portion corresponding to the user-intent in most cases.

The determining (S3) may in effect comprise evaluating a distance on the support from the location of the user-interacting to all the portions, and selecting the portion at the smallest distance from the location of the user-interacting. This evaluating and selecting are in effect implemented in the program or in the system. By then comparing all distances, the nearest portion may then be determined (S3).

The evaluated distance is thus a distance on the support (i.e. a distance between A and B on the support being the length of the smallest path on the support between points of A and points of B). The evaluation of the distance is performed automatically, by the computer, e.g. using a pre-defined distance computation scheme. If at least two portions are determined as having the same distance to the location, one of the portions may be selected arbitrarily (for example, the first one for which the distance has been computed, or, the largest one). Alternatively, nothing is done until the user interacts somewhere where the ambiguity is not present anymore. However, this situation is not frequent since the user naturally sketches the stroke near the shape to be selected (according to the distance).

The distance may be any type of distance, for example Euclidian in case the support is a plane such as the screen plane, or geodesic if the support is a sphere. In order to increase efficiency, the at least one location may be a set of points (e.g. of the screen plane). For example the set of points corresponds to one or several positions of a cursor of a haptic device or a touch-pen on the screen plane. The computed distance between the location and a portion may then be the minimum of distances between the points of the location and the portion. This increases speed efficiency of the determination (S3).

The distance from the location of the user-interacting (S2) to a respective portion may be the minimum of distances from the location of the user-interacting to points associated to the respective portion. Indeed, the portions may also be represented by points on the support (e.g. on the screen plane). This increases efficiency as such a minimum is determined in short time.

The points associated to the respective portion may comprise shape points which are determined by discretizing the shapes and then projecting the discretized shapes on the support. As the shapes are parametric, discretizing a shape means sampling it in sampled points, e.g. by deriving points out of the parametric function(s). Projecting a shape may then consist in projecting the sampled points. The projection may be any projection, e.g. perspective, isometric, or oblique, according to the view point of the user. The projections of the sampled points are called "shape points". This increases CPU efficiency as projecting points is less costly. The distance between a stroke point and the projection may be the minimum of distances between the stroke point and the shape points. Such minimum may be computed. At this stage, the determination (S3) may thus consist in solving the following optimization program: min distance(point of location, shape point), the min being evaluated over the points of the location and over all shape points.

Now an example of the method is provided with reference to FIGS. 4-21. In this example, the user-interacting (S2) comprises a triggering and a moving of a pointer 50, and the location of the user-interacting (S2) is the location of the pointer 50 on the support at the triggering. The support may the screen plane. In such a case, the location of the user-interacting (S2) is the exact position (i.e. a point) where the triggering is performed. The triggering may be a mouse click, or a first contact of a touch-pen on a touch-pad or a first pressure on a sensitive screen. In this example, both an open circle 40 (which is a circle with an aperture 45) and a line 42 are displayed on the screen. FIGS. 4-6 show schematically the design area of the screen, whereas FIGS. 7-21 focus on one of the two shapes. The open circle (40) and the line (42) are 3D and parametric. They are both divided in five portions in this example (however, in general, the shapes may be divided in any number of several portions, not necessarily the same number for all shapes). The portions are not represented. Thus, the user does not see the portions while user-interacting (S2).

The open circle 40 has a central portion, to which a moving operation is associated, two extremity portions, to which an extension (e.g. the "stretch" operation mentioned earlier) operation is associated, and two intermediate portions between the extremity portions and the central portion, to which an expansion operation (e.g. the scale operation mentioned earlier) is associated.

The line 42 has a central portion, to which a moving operation is associated, two extremity portions, to which the extension operation is associated, and two intermediate portions between the extremity portions and the central portion, to which a rotation operation is associated.

Referring to FIG. 5, the user interacts (S2) by first clicking near the right extremity portion of the open circle 40, as attests the position of the pointer 45 on FIG. 5. Then, by moving the pointer 45 to another position (the move being represented by a stroke 60 on FIG. 6), the user increases the aperture 45. Automatically, on the first click, the system has determined (S3) the portion to be the right extremity portion of open circle 45. As the operation assigned to this portion is the stretch, the stretch operation is performed (S4) according to the move. In the case of the example, the aperture is increased as the length of the open circle 45 is decreased.

FIGS. 7-9 illustrate the performing (S4) of the expand operation by first clicking near the right intermediate portion of the open circle 45 (as can be seen from the position of the pointer 45 on FIG. 8). FIG. 9 shows that the open circle 40 has an increased radius compared to its previous state (represented by reference 90 for comparison, although previous state 90 is not necessarily actually displayed) if the pointer is moved according to stroke 60.

FIGS. 10-12 illustrate the performing (S4) of the move operation by first clicking near the central portion of the open circle 40 (as can be seen from the position of the pointer 45 on FIG. 11). FIG. 12 shows that the open circle 40 is moved to the right compared to its previous state 90 if the pointer is moved according to stroke 60.

Figure 13:
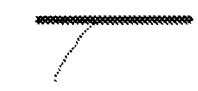
Figure 14:
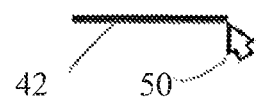
Figure 15:
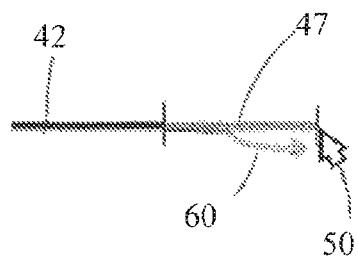

FIGS. 13-15 illustrate the performing (S4) of the move operation by first clicking near the right extremity portion of the line 42 (as can be seen from the position of the pointer 45 on FIG. 14). FIG. 15 shows that the line 42 is stretched to the right by adding length 47 if the pointer is moved according to stroke 60.

Figure 16:
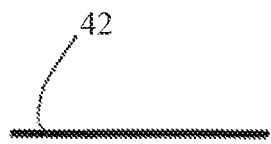
Figure 17:
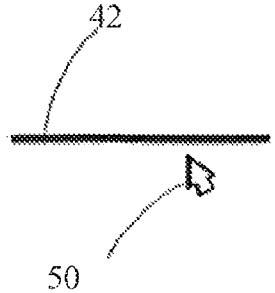
Figure 18:
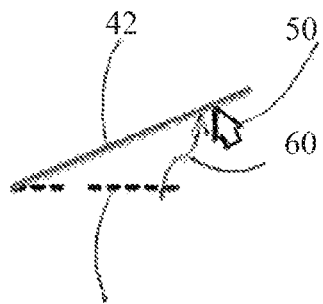

FIGS. 16-18 illustrate the performing (S4) of the rotate operation by first clicking near the right intermediate portion of the line 42 (as can be seen from the position of the pointer 45 on FIG. 17). FIG. 18 shows that the line 42 is rotated up according to an axis corresponding to the left extremity (compared to its previous state 92 represented in dotted line) if the pointer is moved according to stroke 60.

Figure 19:
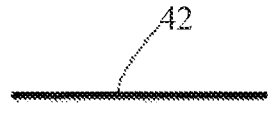
Figure 20:
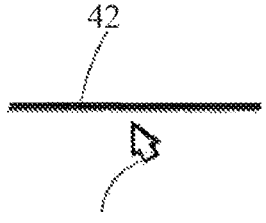
Figure 21:
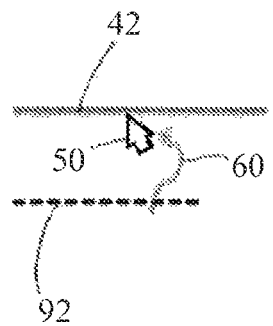

FIGS. 19-21 illustrate the performing (S4) of the move operation by first clicking near the central portion of the line 42 (as can be seen from the position of the pointer 45 on FIG. 20). FIG. 21 shows that the line 42 is moved up (compared to its previous state 92 represented in dotted line) if the pointer is moved according to stroke 60.

Thus, by an iteration of the following simple sequence:
move pointer on the screen;
click, thereby determining (S3) one portion upon a location of the user-interacting on a support, the determining being performed among all the portions (of all shapes);
move pointer, thereby performing (S4), on the shape to which the determined portion belongs, the operation assigned to this portion; and
release; thereby ending the performing (S4);
it is possible to determine (S3) at different iterations different portions, and perform different operations. For example, it is possible to perform the operations from FIG. 4 to FIG. 21. Notably, it is possible to first stretch the open circle 40 by increasing the aperture 45, then expand the circle, then move the circle, then stretch the line.

Possibly, the click may be replaced by applying an initial pressure in case of pressure-sensitive technology. Possibly the click may be followed directly by a release. The ending of the performing (S4) may then be executed upon another click.

In all cases, the method improves ergonomics as manipulators are not required. Indeed, based only on a location of the user-interacting, the method may determine and perform the operation. Thus, the method may exclude displaying manipulators to the user.

What is claimed is:

1. A computer-implemented method for designing a CAD modeled object, wherein the method comprises:
displaying several three-dimensional parametric curves on a screen modeled by a function $C(u)=(x(u), y(u), z(u))$, wherein each of the several three-dimensional parametric curves is divided in several portions according to pointing points of a curve given by $P_u=(x(u), y(u), z(u))$ to a different design operation based on a value of u, wherein each three-dimensional parametric curve comprises a central portion, to which a moving operation is assigned and at least one extremity portion, to which an extension operation is assigned, for a given curve, there being a different design operation being assigned to each portion of the curve;
user-interacting with the screen;
determining one portion upon a location of the user-interacting on a support, the determining being performed among all the portions; and
performing, on the curve to which the determined portion belongs, the operation assigned to this portion.

2. The method of claim 1, wherein the determined portion is evaluated to be at a smallest distance on the support from the location of the user-interacting among all the portions.

3. The method of claim 2, wherein the determining comprises evaluating a distance on the support from the location of the user-interacting to all the portions, and selecting the portion at the smallest distance from the location of the user-interacting.

4. The method of claim 3, wherein the user-interacting comprises a triggering and a moving of a pointer, and the location of the user-interacting is a location of the pointer on the support at the triggering.

5. The method of claim 3, wherein the distance from the location of the user-interacting to a respective portion is a minimum of distances from the location of the user-interacting to points associated to the respective portion.

6. The method of claim 5, wherein the points associated to the respective portion comprise curve points which are determined by discretizing the curve and then projecting the discretized curve on the support.

7. The method of claim 1, wherein the support is a plane of the screen.

8. The method of claim 1, wherein each three-dimensional parametric curve comprises at least one intermediate portion, to which an expansion operation is assigned.

9. A CAD system comprising:
a memory for storing several three-dimensional parametric curves modeled by a function $C(u)=(x(u), y(u), z(u))$, wherein each of the several three-dimensional parametric curves is divided in several portions according to pointing points of a curve given by $P_u=(x(u), y(u), z(u))$ to a different design operation based on a value of u, wherein each three-dimensional parametric curve comprises a central portion, to which a moving operation is assigned and at least one extremity portion, to which an extension operation is assigned, for a given curve, there being a different design operation being assigned to each portion of the curve; and
a graphical user interface coupled with the memory and a processor and suitable for performing a computer-implemented method for designing a CAD modeled object, wherein the method comprises:
displaying the several three-dimensional parametric curves on a screen;
user-interacting with the screen;
determining one portion upon a location of the user-interacting on a support, the determining being performed among all the portions; and
performing, on the curve to which the determined portion belongs, the operation assigned to this portion.

10. A non-transitory computer readable storage medium comprising:
a memory storage system having recorded thereon a computer program comprising instructions for designing a CAD modeled object, wherein the instructions include:
displaying several three-dimensional parametric curves on a screen modeled by a function $C(u)=(x(u), v(u), z(u))$, wherein each of the several three-dimensional parametric curves is divided in several portions according to pointing points of a curve given by $P_u=(x(u), y(u), z(u))$ to a different design operation based on a value of u, wherein each three-dimensional parametric curve comprises a central portion, to which a moving operation is assigned and at least one extremity portion, to which an extension operation is assigned, for a given curve, there being a different design operation being assigned to each portion of the curve;
user-interacting with the screen;
determining one portion upon a location of the user-interacting on a support, the determining being performed among all the portions; and
performing, on the curve to which the determined portion belongs, the operation assigned to this portion.

11. The non-transitory computer readable storage medium of claim 10, wherein the determined portion is evaluated to be at a smallest distance on the support from the location of the user-interacting among all the portions.

12. The non-transitory computer readable storage medium of claim 11, wherein the determining comprises evaluating a distance on the support from the location of the user-interacting to all the portions, and selecting the portion at the smallest distance from the location of the user-interacting.

13. The non-transitory computer readable storage medium of claim 10, wherein each three-dimensional parametric curve comprises at least one intermediate portion, to which an expansion operation is assigned.

14. The CAD system of claim 9, wherein the determined portion is evaluated to be at a smallest distance on the support from the location of the user-interacting among all the portions.

15. The CAD system of claim 14, wherein the determining comprises evaluating a distance on the support from the location of the user-interacting to all the portions, and selecting the portion at the smallest distance from the location of the user-interacting.

16. The CAD system of claim 15, wherein the user-interacting comprises a triggering and a moving of a pointer, and the location of the user-interacting is a location of the pointer on the support at the triggering.

17. The CAD system of claim 15, wherein the distance from the location of the user-interacting to a respective portion is a minimum of distances from the location of the user-interacting to points associated to the respective portion.

18. The CAD system of claim 17, wherein the points associated to the respective portion comprise curve points which are determined by discretizing the curve and then projecting the discretized curve on the support.

19. The CAD system of claim 9, wherein the support is a plane of the screen.

20. The CAD system of claim 9, wherein each three-dimensional parametric curve comprises at least one intermediate portion, to which an expansion operation is assigned.

* * * * *